(12) United States Patent
You et al.

(10) Patent No.: US 12,435,419 B2
(45) Date of Patent: Oct. 7, 2025

(54) NITRIDE-BASED WAFER CHEMICAL VAPOR DEPOSITION DEVICE AND DEPOSITION METHOD OF THE SAME

(71) Applicant: INNOSCIENCE (SUZHOU) SEMICONDUCTOR CO., LTD., Suzhou (CN)

(72) Inventors: Tinglin You, Suzhou (CN); Pi He, Suzhou (CN); Wen-Yuan Hsieh, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/921,364

(22) PCT Filed: Sep. 7, 2022

(86) PCT No.: PCT/CN2022/117623
§ 371 (c)(1),
(2) Date: Oct. 26, 2022

(87) PCT Pub. No.: WO2024/050727
PCT Pub. Date: Mar. 14, 2024

(65) Prior Publication Data
US 2024/0384415 A1 Nov. 21, 2024

(51) Int. Cl.
*C23C 16/458* (2006.01)
*C23C 16/14* (2006.01)
(Continued)

(52) U.S. Cl.
CPC .......... *C23C 16/4585* (2013.01); *C23C 16/14* (2013.01); *C23C 16/34* (2013.01); *H01L 21/28575* (2013.01); *H10D 30/475* (2025.01)

(58) Field of Classification Search
CPC ............ H01L 21/285; H01L 21/28575; H10D 30/475; C23C 16/14; C23C 16/303; C23C 16/34; C23C 16/458; C23C 16/4585
See application file for complete search history.

(56) References Cited

U.S. PATENT DOCUMENTS 5,810,931 A * 9/1998 Stevens ............. H01L 21/68721
118/721
6,489,239 B1 12/2002 Jang et al.
(Continued)

FOREIGN PATENT DOCUMENTS

CN 104995727 A 10/2015
CN 105336640 A 2/2016
(Continued)

OTHER PUBLICATIONS

ISA State Intellectual Property Office of the People's Republic of China, International Search Report Issued in Application No. PCT/CN2022/117623, Dec. 29, 2022, WIPO, 5 pages.
(Continued)

*Primary Examiner* — Brook Kebede
(74) *Attorney, Agent, or Firm* — McCoy Russell LLP

(57) ABSTRACT

A nitride-based wafer CVD device comprises a heat carrier, a nitride-based wafer, and a clamping ring. The heat carrier comprises a carrier surface. The nitride-based wafer is disposed on the carrier surface. The clamping ring is disposed above the carrier surface and the nitride-based wafer. The clamping ring comprises a tilted surface, and a polished surface, and the polished surface is opposite to the tilted surface. The nitride-based wafer has a plurality of HEMT devices. The polished surface and the carrier surface are parallel. A distance between the polished surface and the
(Continued)

carrier surface in a first direction is in a range from 1.1 mm to 1.2 mm, and the first direction is parallel to a normal of the carrier surface.

20 Claims, 14 Drawing Sheets

(51) Int. Cl.
  *C23C 16/34* (2006.01)
  *H01L 21/285* (2006.01)
  *H10D 30/47* (2025.01)

(56) References Cited

U.S. PATENT DOCUMENTS

| | | | |
|---|---|---|---|
| 7,927,424 B2* | 4/2011 | Sidhwa | H01L 21/68735 118/724 |
| 2003/0196604 A1* | 10/2003 | Sidhwa | H01L 21/68735 118/728 |
| 2003/0205192 A1 | 11/2003 | Aiba et al. | |
| 2015/0228530 A1 | 8/2015 | Rohrmann et al. | |

FOREIGN PATENT DOCUMENTS

| | | |
|---|---|---|
| CN | 112204725 A | 1/2021 |
| EP | 0595307 A2 | 5/1994 |
| KR | 20000010795 U | 6/2000 |

OTHER PUBLICATIONS

ISA State Intellectual Property Office of the People's Republic of China, Written Opinion of the International Searching Authority Issued in Application No. PCT/CN2022/117623, Dec. 29, 2022, WIPO, 5 pages.

State Intellectual Property Office of the People's Republic of China, Office Action and Search Report Issued in Application No. 202280004803.7, Apr. 17, 2025, 20 pages. (Submitted with Machine Translation).

* cited by examiner

NITRIDE-BASED WAFER CHEMICAL VAPOR DEPOSITION DEVICE AND DEPOSITION METHOD OF THE SAME

FIELD OF THE INVENTION

The present invention generally relates to a deposition device. More specifically, the present invention relates to a chemical vapor deposition device for a high electron mobility transistor (HEMT) nitride-based semiconductor device.

BACKGROUND OF THE INVENTION

In recent years, intense research on high-electron-mobility transistors (HEMTs) has been prevalent for semiconductor devices, such as high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a nitride-based wafer chemical vapor deposition (CVD) device is provided. The nitride-based wafer CVD device comprises a heat carrier, a nitride-based wafer, and a clamping ring. The heat carrier comprises a carrier surface. The nitride-based wafer is disposed on the carrier surface. The clamping ring is disposed above the carrier surface and the nitride-based wafer. The clamping ring comprises a tilted surface, and a polished surface, and the polished surface is opposite to the tilted surface. The nitride-based wafer has a plurality of HEMT devices. The polished surface and the carrier surface are parallel. A distance between the polished surface and the carrier surface in a first direction is in a range from 1.1 mm to 1.2 mm, and the first direction is parallel to a normal of the carrier surface.

In accordance with one aspect of the present disclosure, a deposition method of a nitride-based wafer CVD device is provided. The method includes steps as follows: grinding a clamping ring and reducing a thickness of the clamping ring; disposing a nitride-based wafer on a carrier surface of a heat carrier; and depositing conductive materials on the nitride-based wafer. A polished surface is formed on the clamping ring after the step of grinding the clamping ring. The nitride-based wafer CVD device comprises the heat carrier, the nitride-based wafer, and the clamping ring. The heat carrier comprises the carrier surface. The clamping ring is disposed above the carrier surface and the nitride-based wafer. The clamping ring comprises a tilted surface and the polished surface. The polished surface is opposite to the tilted surface. The nitride-based wafer has a plurality of HEMT devices. The polished surface and the carrier surface are parallel. The distance between the polished surface and the carrier surface in a first direction is in a range from 1.1 mm to 1.2 mm, and the first direction is parallel to a normal of the carrier surface.

In accordance with one aspect of the present disclosure, a deposition method of a nitride-based wafer CVD device is provided. The method includes steps as follows: moving a clamping ring upward, wherein a polished surface of the clamping ring is moved away from a carrier surface of a heat carrier; disposing a nitride-based wafer on the carrier surface of the heat carrier, wherein the nitride-based wafer has a plurality of HEMT devices; depositing a conductive layer on the HEMT devices; depositing a tungsten layer covering the conductive layer; and introducing a gas flow upward from a gap between the conductive layer and the clamping ring at a condition of a distance between the carrier surface and the clamping ring increased to 1.2 mm.

By applying the above configuration, conductive layer or tungsten layer without peeling can be achieved during deposition. As such, a wafer having HEMT devices can be manufactured with high quality conductive layer or tungsten layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
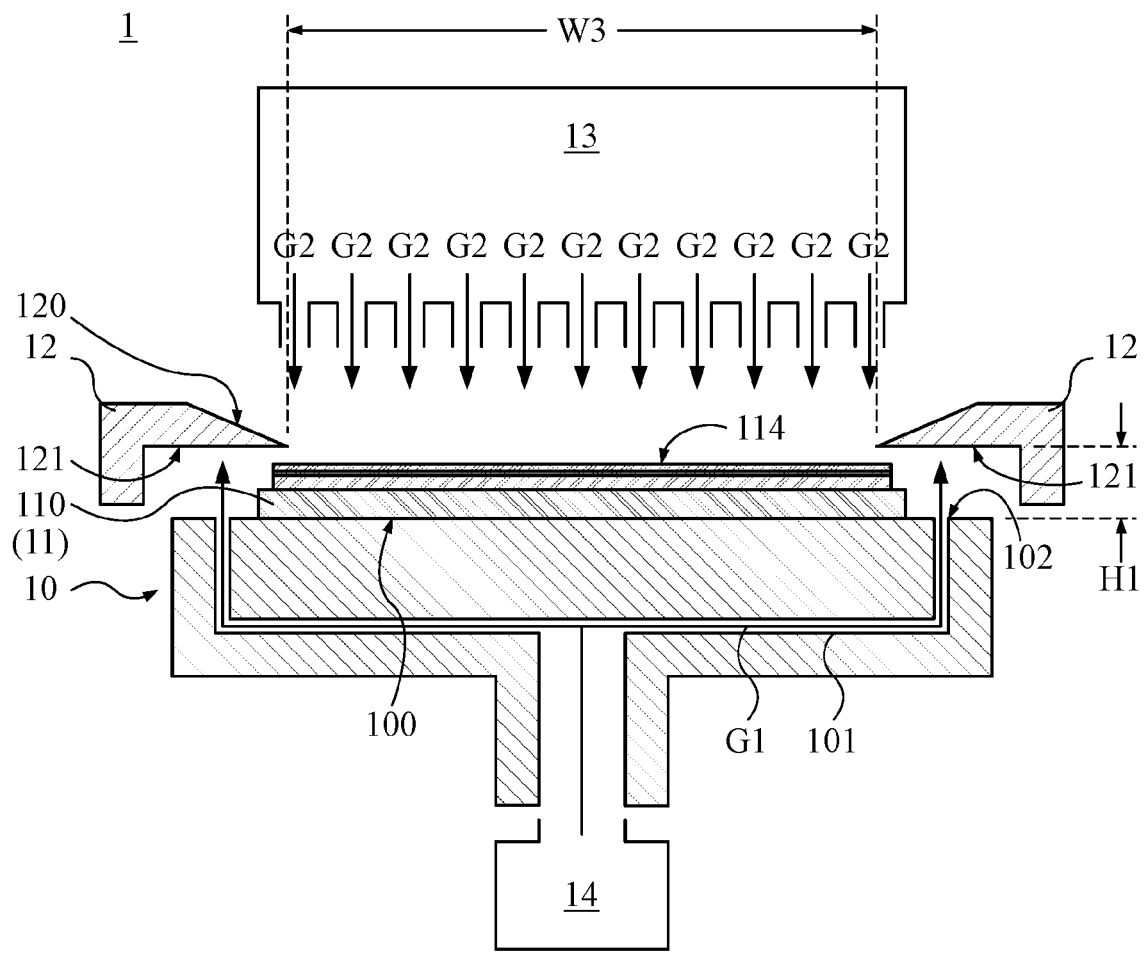
FIG. 1 is a side sectional view of a nitride-based wafer CVD device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, nitride-based wafer CVD devices, deposition methods of the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a side sectional view of a nitride-based wafer CVD device according to some embodiments of the present disclosure. The nitride-based wafer CVD device 1 comprises a heat carrier 10, a nitride-based wafer 11, and a clamping ring 12. The heat carrier 10 has a carrier surface 100, and the nitride-based wafer 11 is disposed on the carrier surface 100. The clamping ring 12 is disposed above the carrier surface 100 and the nitride-based wafer 11.

The clamping ring 12 comprises a tilted surface 120, and a polished surface 121, and the polished surface 121 is opposite to the tilted surface 120. In other words, in this embodiment, when the polished surface 121 is horizontally disposed, the tilted surface 120 is oblique. The tilted surface 120 near the center of the clamping ring 12 has lower altitude, and the tilted surface 120 away from the center has higher altitude.

The nitride-based wafer 11 has a plurality of HEMT devices. To be specific, the nitride-based wafer 11 has a first nitride layer, and a second nitride layer. The second nitride layer is disposed on the first nitride layer, and a band gap of the second nitride layer is higher than a band gap of the first nitride layer, and a 2DEG region is formed near an interface between the first nitride layer and the second nitride layer. The first nitride layer and the second nitride layer form the HEMT devices. For example, the first nitride layer may include gallium nitride (GaN), and the second nitride layer may include aluminum gallium nitride (AlGaN), and the nitride-based wafer CVD device 1 is configured to deposit a conductive layer on the nitride-based wafer 11 having GaN and AlGaN.

To be specific, the exemplary materials of the nitride layers can include, for example but are not limited to, nitrides or group III-V compounds, such as GaN, AlN, InN, InAlN, $In_xAl_yGa_{(1-x-y)}N$ where x+y≤1, $Al_yGa_{(1-y)}N$ where y≤1.

The exemplary materials of the nitride layers are selected such that the second nitride layer has a bandgap (i.e., forbidden band width) greater than a bandgap of the second nitride layer, which causes electron affinities thereof different from each other and forms a heterojunction therebetween. As such, the nitride layers can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction.

The clamping ring 12 is located above the heat carrier 10, and the polished surface 121 and the carrier surface 100 are parallel. The polished surface 121 and the carrier surface 100 are facing towards each other's, and a distance H1 between the polished surface 121 and the carrier surface 100 in a direction d1 is 1.15 mm. The direction d1 is parallel to a normal or normal vector of the carrier surface 100. In some embodiment, the distance H1 between the polished surface 121 and the carrier surface 100 in the direction d1 is in a range from 1.1 mm to 1.2 mm.

In this embodiment, a gap is form between the heat carrier 10 and the clamping ring 12, and the heat carrier 10 and the clamping ring 12 remain a distance H1 between the carrier surface 100 and the polished surface 121, and a gas flow can pass through the gap between the heat carrier 10 and the clamping ring 12. For example, the gas flow can provide substance function as cocatalyst, and the distance H1 between the carrier surface 100 and the polished surface 121 provide a sufficient space to provide the substance with the gas flow. Therefore, a proper deposition can be form on the nitride-based wafer 11 without peeling. For example, when a tungsten layer is deposited on the nitride-based wafer 11, the tungsten layer can substantially cover more than 98.4% of a top area of the nitride-based wafer 11 without peeling in the periphery of the nitride-based wafer 11.

In some embodiment, the polished surface 121 is formed through polishing or grinding, and a radial veined pattern is form on the polished surface 121. A plurality of shallow trenches pointing towards the center of the clamping ring 12 are formed on the polished surface 121, and the radial veined pattern comprising the shallow trenches may improve the efficiency of gas transferring. In other words, the gas may be provided with a sufficient rate with the polished surface 121 having the radial veined pattern, and the shallow trenches may guide the gas flow properly.

Referring to FIG. 1, in this embodiment, the clamping ring 12 is ground and the thickness of the clamping ring 12 is reduced, and the distance H1 between the carrier surface 100 and the polished surface 121 is increased. Therefore, the flowing rate of the gas is high enough for the deposition of a conductive layer on the nitride-based wafer 11, and peeling of the conductive layer can be prevented. To be specific, by grinding the clamping ring 12, the distance between a top surface 114 of the nitride-based wafer 11 and the polished surface 121 is increased, and sufficient gas will reach the top surface 114, and the peeling can be prevented.

In this embodiment, the heat carrier 10 has a gas tunnel 101. The gas tunnel 101 connects a bottom of the heat carrier 10 and the carrier surface 100 of the heat carrier 10. The gas tunnel 101 form an opening 102 surrounding the carrier surface 100. To be specific, the opening 102 has a ring-liked shape, and the opening 102 is adjacent to a periphery of the carrier surface.

In the direction d1, the distance H1 between the opening 102 and the polished surface 121 falls in the range from 1.15 mm. Therefore, a sufficient space is provided above the opening 102, and a gas flow can easily pass through the space and reach the top surface 114 of the nitride-based wafer 11 of the carrier surface 100. In some embodiment, the distance H1 falls in the range from 1.1 mm to 1.2 mm.

Also, the gas tunnel 101 is connected to a space between the clamping ring 12 and the heat carrier 10, and the nitride-based wafer 11 on the carrier surface 100 is located in the space between the clamping ring 12 and the heat carrier 10. Therefore, the gas flow can reach the nitride-based wafer 11 easily through the gas tunnel 101. Also, with the polished surface 121, the gas flow can be guided towards the nitride-based wafer 11 properly.

To be specific, the gas tunnel 101 is configured to provide hydrogen G1. During a deposition process of the nitride-based wafer CVD device 1, hydrogen G1 is introduced through the gas tunnel 101, and hydrogen G1 can reach the nitride-based wafer 11 on the carrier surface 100. Therefore, a conductive layer on the nitride-based wafer 11 may be formed through the deposition process. For example, the conductive layer may include tungsten, titanium, or titanium nitride. The nitride-based wafer CVD device 1 may comprise a gas source 14, and the gas source 14 is connected to the gas tunnel 101. The gas source 15 can provide hydrogen G1 to the nitride-based wafer 11 through the gas tunnel 101.

In this embodiment, the nitride-based wafer CVD device 1 comprises a gas provider 13. The gas provider 13 is disposed above the carrier surface 100. The gas provider 13 is configured to provide a gas G2. For example, the gas G2 includes tungsten hexafluoride and silane, and a tungsten layer can be deposited on the nitride-based wafer 11. For another example, the gas G2 includes tungsten hexafluoride, hydrogen, nitrogen and silane, and a titanium layer or a titanium nitride layer can be deposited on the nitride-based wafer 11.

The gas provider 13 provides the gas G2 on to the top surface 114 of the nitride-based wafer 11, and the area exposed by the clamping ring 12 can be increased. Since the tilted surface 120 is at the top of the clamping ring 12, by grinding the polished surface 121 at the bottom, a width W3 of the opening of the clamping ring 12 along a direction d2, which is perpendicular to direction d1, can be increased. Therefore, providing rate of the gas G2 can be increased as well, and deposition of a conductive layer can be conducted without peeling.

Figure 2:
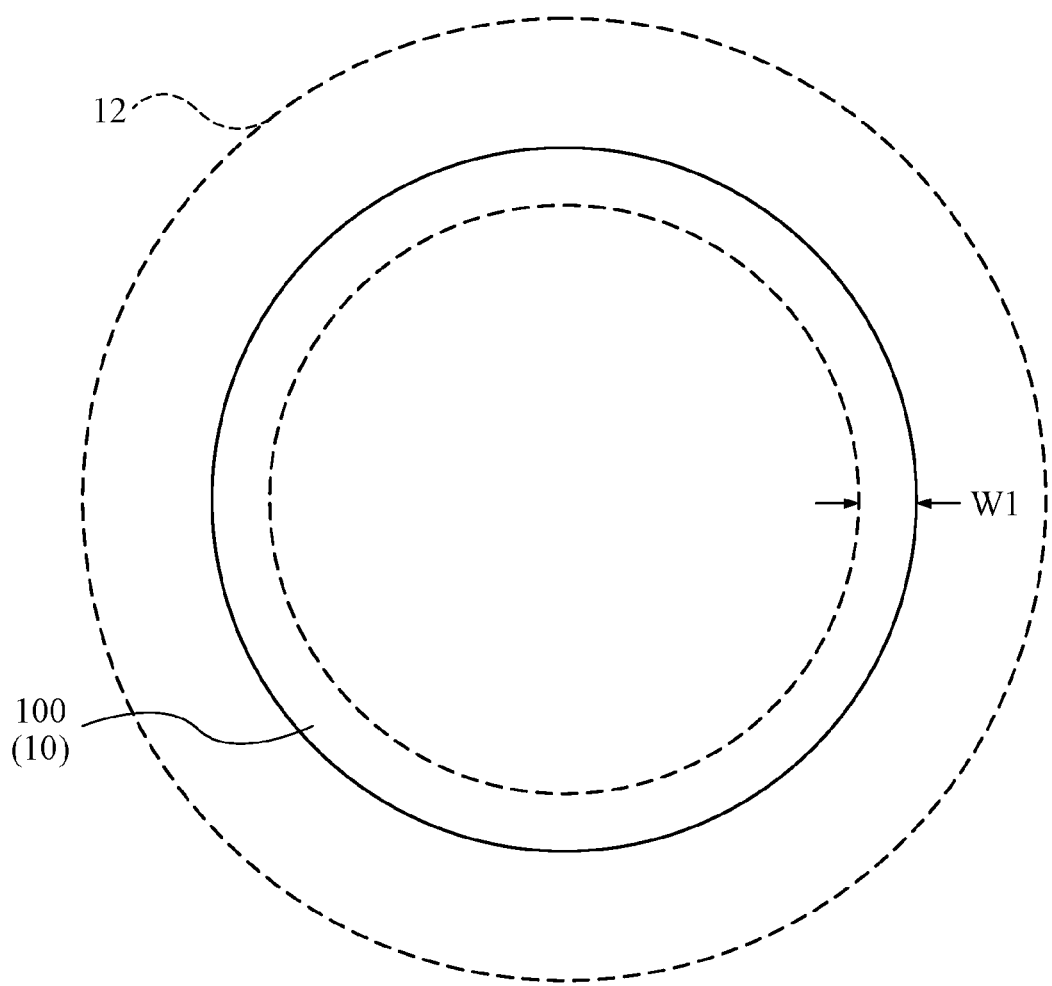
FIG. 2 is a top view of a heat carrier and the clamping ring according to some embodiments of the present disclosure.

FIG. 2 is a top view of the heat carrier and the clamping ring according to some embodiments of the present disclosure, and, for clarity, the clamping ring is illustrated with doted lines. In this embodiment, the clamping ring 12 covers a ring-shaped area on the carrier surface 100, and a width W1 of the clamping ring 12 covering the carrier surface 100 is 20 mm. In other words, the clamping ring 12 covers the periphery of the carrier surface 100, and the central area of the carrier surface 100 is exposed by the clamping ring 12, so the nitride-based wafer 11 on the carrier surface 100 can receive gas G2 from the gas provider 13. By providing sufficient gas G2 on the carrier surface 100, a conductive layer without peeling can be deposited on the nitride-based wafer 11. In some embodiments, the width W1 falls in a range from 19.94 mm to 20.06 mm.

Figure 3:
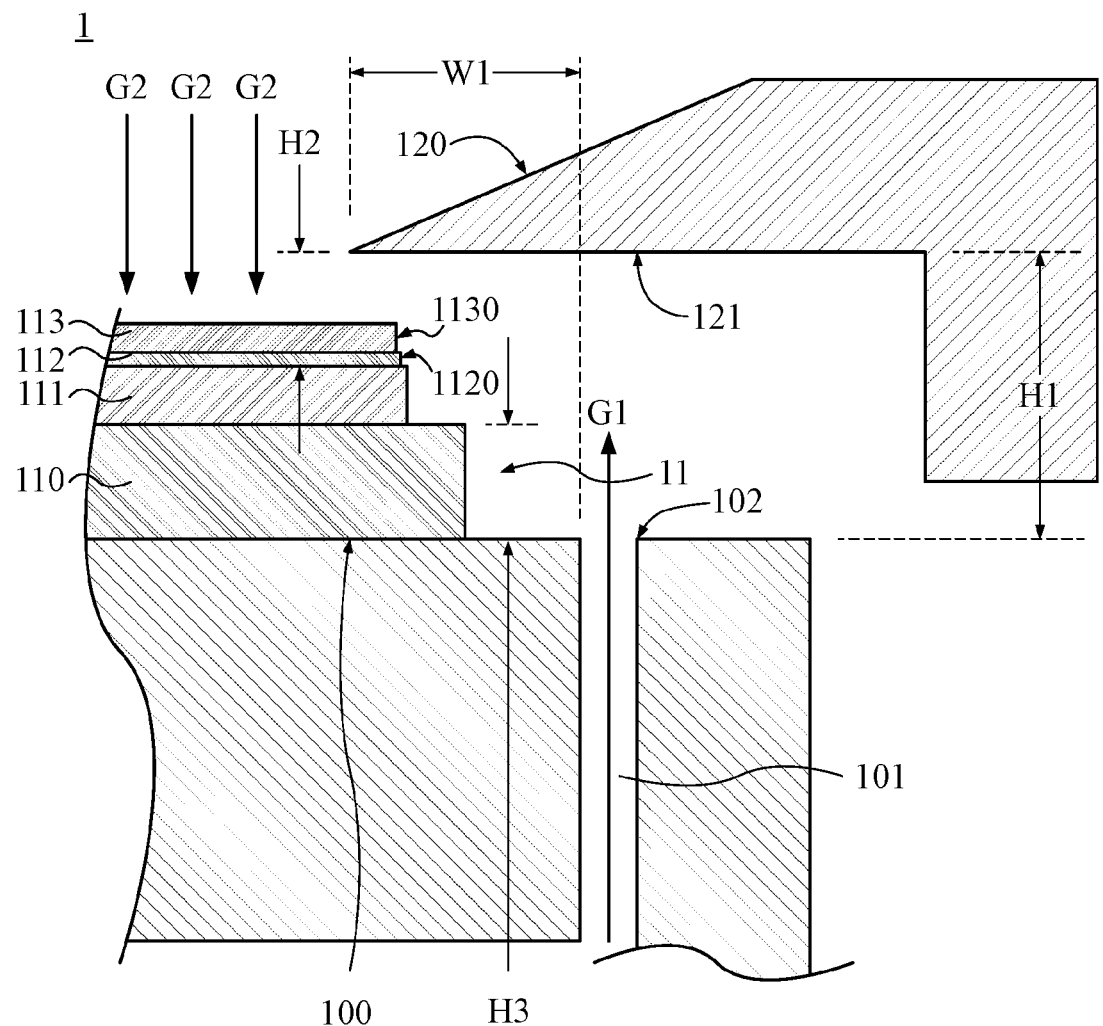
FIG. 3 is another side sectional view of a nitride-based wafer CVD device according to some embodiments of the present disclosure.
Figure 3:
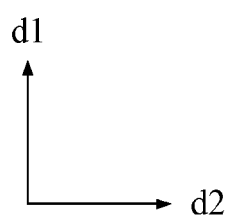

FIG. 3 is another side sectional view of the nitride-based wafer CVD device according to some embodiments of the present disclosure, and FIG. 3 is a enlarge view according to an area in FIG. 1. The width W1 of the clamping ring 12 covering the carrier surface 100 is 20 mm. In some embodiments, the width W1 falls in a range from 19.94 mm to 20.06 mm.

In this embodiment, the nitride-based wafer 11 comprises a substrate 110. The HEMT devices are disposed on the substrate 110. The thickness H3 of the substrate 110 is 1150 μm. Therefore, the substrate 100 is configured to form a plurality of nitride-based devices, and the thickness H3 of the substrate 110 is sufficient to deposit the conductive layer in the nitride-based wafer CVD device. In some embodiments, the thickness H3 falls in a range from 1100 μm to 1200 μm.

In this embodiment, the substrate 110 has a substrate layer, the first nitride layer and the second nitride layer. The first nitride layer is disposed above the substrate layer, and the second nitride layer is disposed on the first nitride layer. The exemplary materials of the substrate layer can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate layer can include, for example but are not limited to, group III elements, group IV elements, group V elements, or combinations thereof (e.g., III-V compounds). In other embodiments, the substrate layer can include, for example, but is not limited to, one or more other features, such as a doped region, a buried layer, an epitaxy (epi) layer, or combinations thereof.

In some embodiments, the substrate layer has a nucleation layer. The nucleation layer is formed on the substrate layer. The nucleation layer may form an interface with the substrate layer. The nucleation layer is configured to provide a top surface for growth of III-nitride material thereon. In other words, the nucleation layer forms an appropriate template to transition from lattice of the substrate layer to a template more suitable for growth of III-nitride material. The nucleation layer can provide a transition to accommodate a mismatch/difference between the substrate layer and a III-nitride layer to be formed on the top surface thereof (e.g., epitaxially formation). The mismatch/difference may refer to different lattice constants or thermal expansion coefficients. The exemplary material of the nucleation layer can include, for example but is not limited to AlN or any of its alloys.

In some embodiments, the substrate layer has a buffer layer. The buffer layer is formed on the nucleation layer. The buffer layer may form an interface with the nucleation layer. The buffer layer is configured to reduce lattice and thermal mismatches between the underlying layer and a layer to be formed on the buffer layer (e.g., epitaxially formed thereon), thereby curing defects due to the mismatches/difference. The buffer layer includes a III-V compound. The III-V compound can include, for example but are not limited to, aluminum, gallium, indium, nitride, or combinations thereof. Accordingly, the exemplary materials of the buffer layer can further include, for example but are not limited to, AlN, AlGaN, InAlGaN, or combinations thereof.

The first nitride layer is disposed over the buffer layer. The nitride layer can be a III-V nitride-based semiconductor layer. The exemplary materials of the nitride layer can include, for example but are not limited to, nitrides or group III-V compounds, such as GaN, AlN, InN, InAlN, $In_xAl_y Ga_{(1-x-y)}N$ where $x+y \le 1$, $Al_y Ga_{(1-y)}N$ where $y \le 1$.

Referring to FIG. 3, in this embodiment, the nitride-based wafer 11 has an oxide layer 111. The oxide layer 111 covers the HEMT devices. A distance H2 between the polished surface 121 and the oxide layer 111 in the direction d1 is 0.05 mm. Therefore, oxide layer 111 keep a gap with the clamping ring 12, and a sufficient gas is provided through the gap, and a conductive layer can be disposed properly on the oxide layer 111. In some embodiments, the distance H2 falls in a range from 0.03 mm to 0.07 mm.

The nitride-based wafer 11 of this embodiment comprises a conductive layer 112, and a conductive layer 113. The conductive layer 112 has no peeling structure, and the conductive layer 112 cover more than 95.1% of a top area of the oxide layer 111. The conductive layer 113 has no peeling structure, and the conductive layer 113 cover more than 98.4% of a top area of the conductive layer 112. In other words, conductive layers 112, 113 can cover the oxide layer 111 with high coverage and without no peeling structure.

The conductive layer 112 has an edge 1120, and the edge 1120 is vertical. The conductive layer 113 has an edge 1130, and the edge 1130 is vertical. A horizontal width between the edge 1120 of the conductive layer 112 and the edge 1130 of the conductive layer 113 is less than 200 μm. The distance between the edge 1120 and the edge 1130 along the direction d2 is 200 μm. Therefore, the conductive layer 12 is properly deposited on the conductive layer 113 with high coverage.

To be specific, the conductive layer 112 includes titanium nitride (TiN), and the conductive layer 113 includes tungsten (W). In some embodiment, the conductive layer 112 includes titanium (Ti). By chemical vapor deposition, the conductive layer 112 can be deposited properly on the oxide layer 111 with the gas flow of hydrogen G1 and gas G2. Also, the conductive layer 113 can be deposited properly on the conductive layer 112 with the gas flow of hydrogen G1 and gas G2.

The followings will describe some deposition method of the nitride-based wafer CVD device 1 with reference of a plurality of figures according to some embodiments of the present disclosure.

Figure 4:
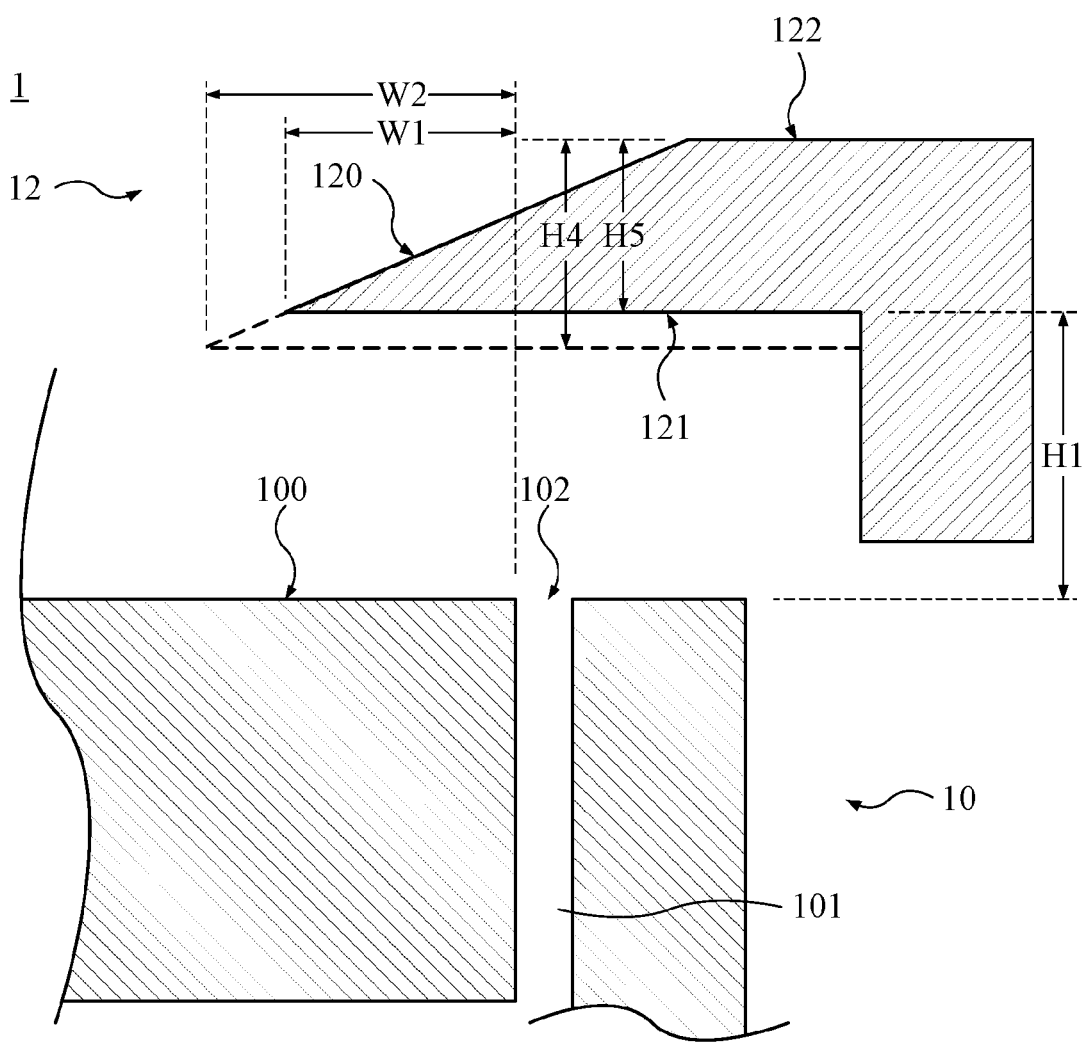
FIG. 4 is a side sectional view of a nitride-based wafer CVD device according to a step of a deposition method of some embodiments of the present disclosure.

FIG. 4 is a side sectional view of the nitride-based wafer CVD device 1 according to a step of a deposition method of some embodiments of the present disclosure. Referring to FIG. 4, the deposition method comprises: grinding the clamping ring 12 and reducing a thickness of the clamping ring 12, wherein a polished surface 121 is formed on the clamping ring 12. In the grinding process, the thickness of the clamping ring 12 is reduced from thickness H4 to thickness H5, and the distance H1 between the polished surface 121 and the carrier surface 100 of the heat carrier 100 is increased.

In this embodiment, the clamping ring 12 is disposed above the carrier surface 100 of the heat carrier 10. After the grinding process, the clamping ring 12 has the tilted surface 120, the polished surface 121, and a top surface 122. The polished surface 121 is facing towards the carrier surface 100, and the tilted surface 120, and the top surface 122 are facing backward towards the carrier surface 100. The tilted surface 120 and the top surface 122 are connected, and the top surface 122 is located far away from the center of the clamping ring 12. During the grinding process, the tilted surface 120 is reduced, and the top surface 122 remains unchanged. Therefore, the polished surface 121 provides more space above the opening 102 of the gas tunnel 101, and the carrier surface 100 that is exposed by the carrier ring 12 is increased.

To be specific, the step of grinding the clamping ring 12 and reducing the thickness of the clamping ring 12 comprises: grinding the thickness of the clamping ring 12 from thickness H4 to thickness H5. For example, along the direction d1, the thickness H4 is 1.34 mm, and the thickness H5 is 1.2 mm. Therefore, a sufficient space is provided between the polished surface 121 and the carrier surface 100 after grinding, and a gas flow from the gas tunnel 101 can easily reach the carrier surface 100.

In one aspect, the step of grinding the clamping ring 12 and reducing the thickness of the clamping ring 12 comprises: grinding a ring-shaped area of the clamping ring 12 that covers the heat carrier 10, wherein the width of the clamping ring 12 covering the heat carrier 10 is reduced from width W2 to width W1. For example, along the direction d2, the width W2 is 20.3 mm, and the width W1 is 20 mm. The area of the carrier surface 100 that is exposed by the clamping ring 12 is increased, and a gas flow from a source above the clamping ring 12 can easily reach the carrier surface 100 with sufficient amount.

In one aspect, the step of grinding the clamping ring 12 and reducing the thickness of the clamping ring 12 comprises: grinding the clamping ring 12 and increasing the distance between the polished surface 121 and the carrier surface 100 in the direction d1. The distance H1 is increased, and a bigger space is provided between the clamping ring 12 and the heat carrier 10. Therefore, an object on the carrier surface 100 can receive a gas flow easily through the gap between the clamping ring 12 and the heat carrier 10.

Figure 5:
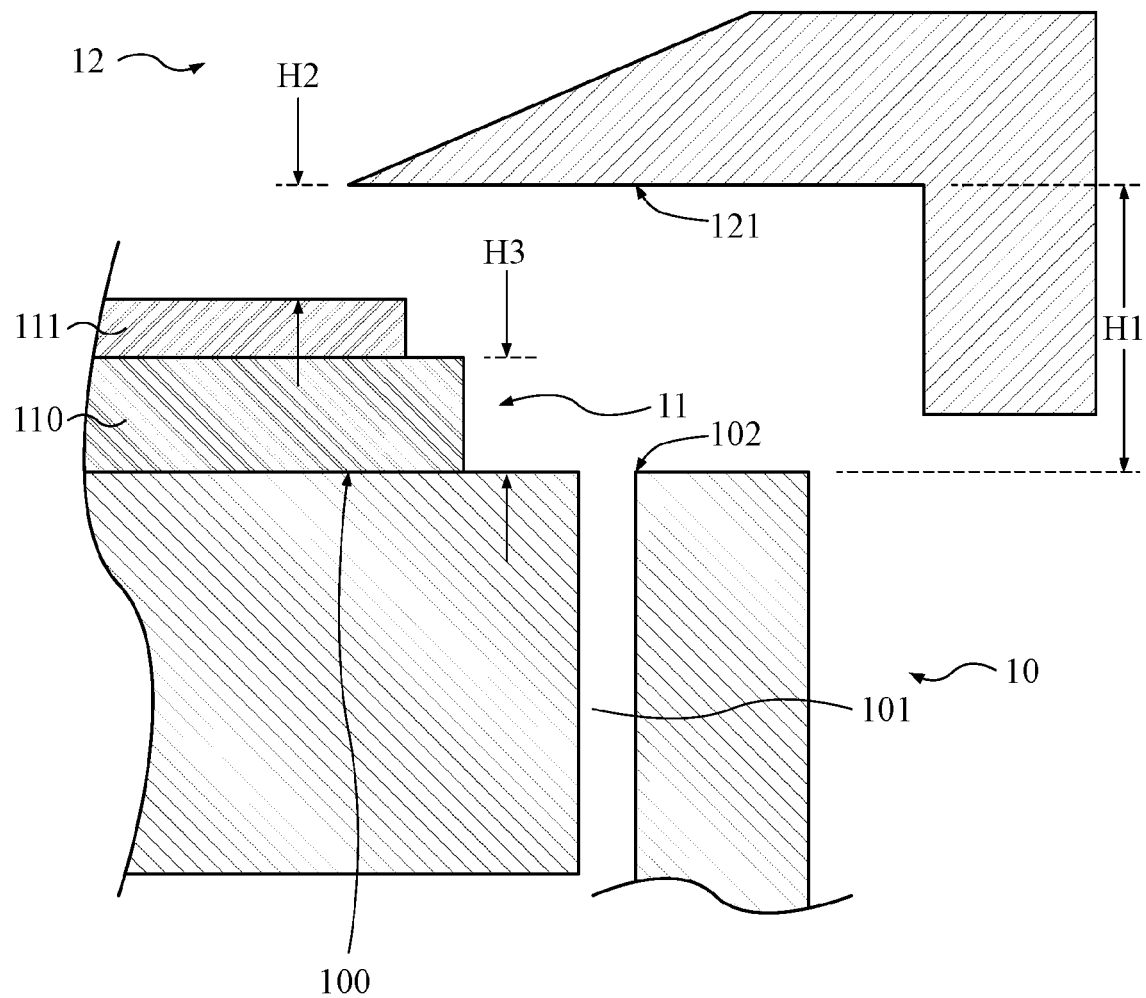
FIG. 5 is a side sectional view of a nitride-based wafer CVD device according to a step of a deposition method of some embodiments of the present disclosure.

FIG. 5 is a side sectional view of the nitride-based wafer CVD 1 according to a step of the deposition method of some embodiments of the present disclosure. Referring to FIG. 5, after the clamping ring 12 is ground, the deposition method comprises: disposing a nitride-based wafer 11 on the carrier surface 100 of the heat carrier 10.

In this embodiment, the nitride-based wafer 11 doesn't cover periphery of the carrier surface 100, and the carrier surface 100 is surrounded by the opening 102 of the gas tunnel 101. The nitride-based wafer 11 has the substrate 110 and the oxide layer 111, and the oxide layer 111 is disposed on the substrate 110. The HEMT devices are disposed on the substrate 110, and the thickness H3 of the substrate 110 is 1150 μm, and the distance H1 is 1.15 mm. Therefore, a continuous space can be remained between the heat carrier 10 and the clamping ring 12.

To be specific, the distance H1 between the carrier surface 100 and the polished surface 121 is 1.15 mm, and the distance H2 between the oxide layer 111 and the polished surface 121 can remain to be 0.05 mm. The area above the oxide layer 111 can receive sufficient gas from the opening 102 of the gas tunnel 101. Therefore, the oxide layer 111 provide a proper platform to perform deposition of conductive material.

Figure 6:
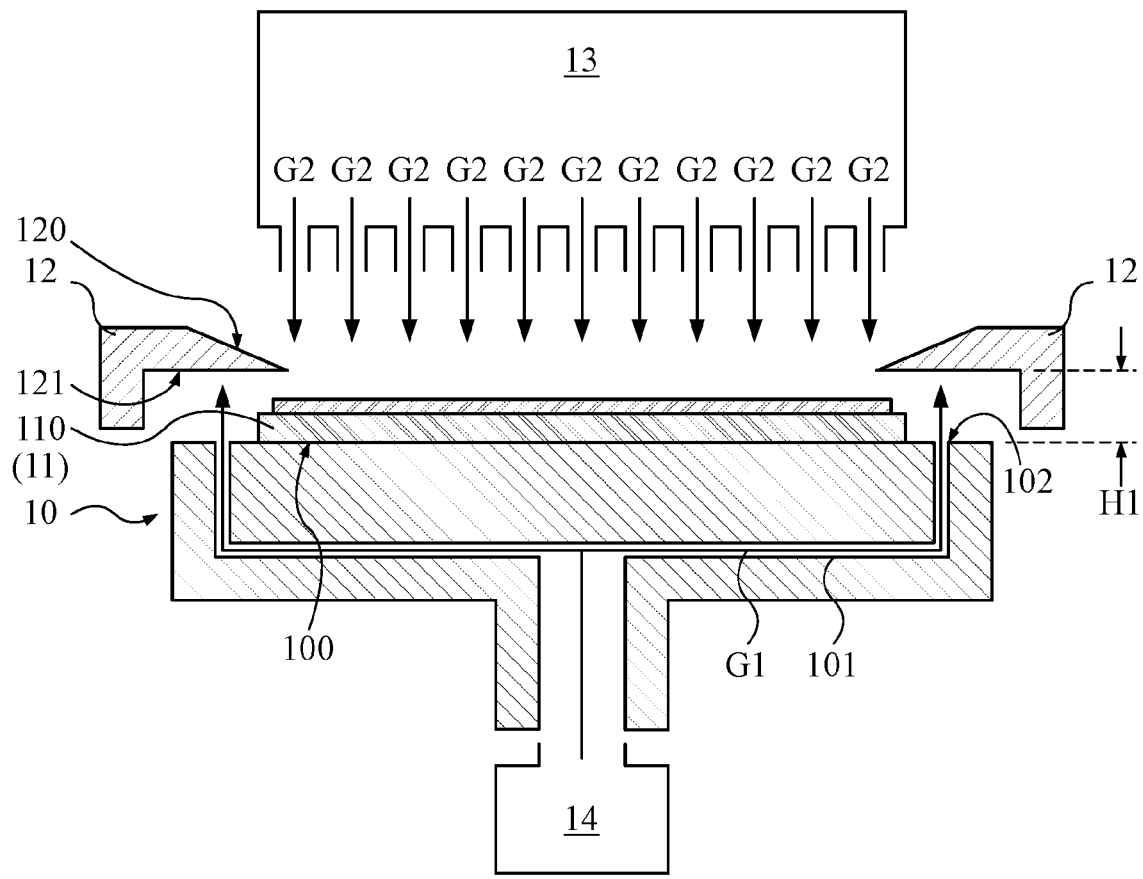
FIGS. 6 to 8 are side sectional views of a nitride-based wafer CVD device according to steps of a depositing method of some embodiments of the present disclosure.
Figure 7:
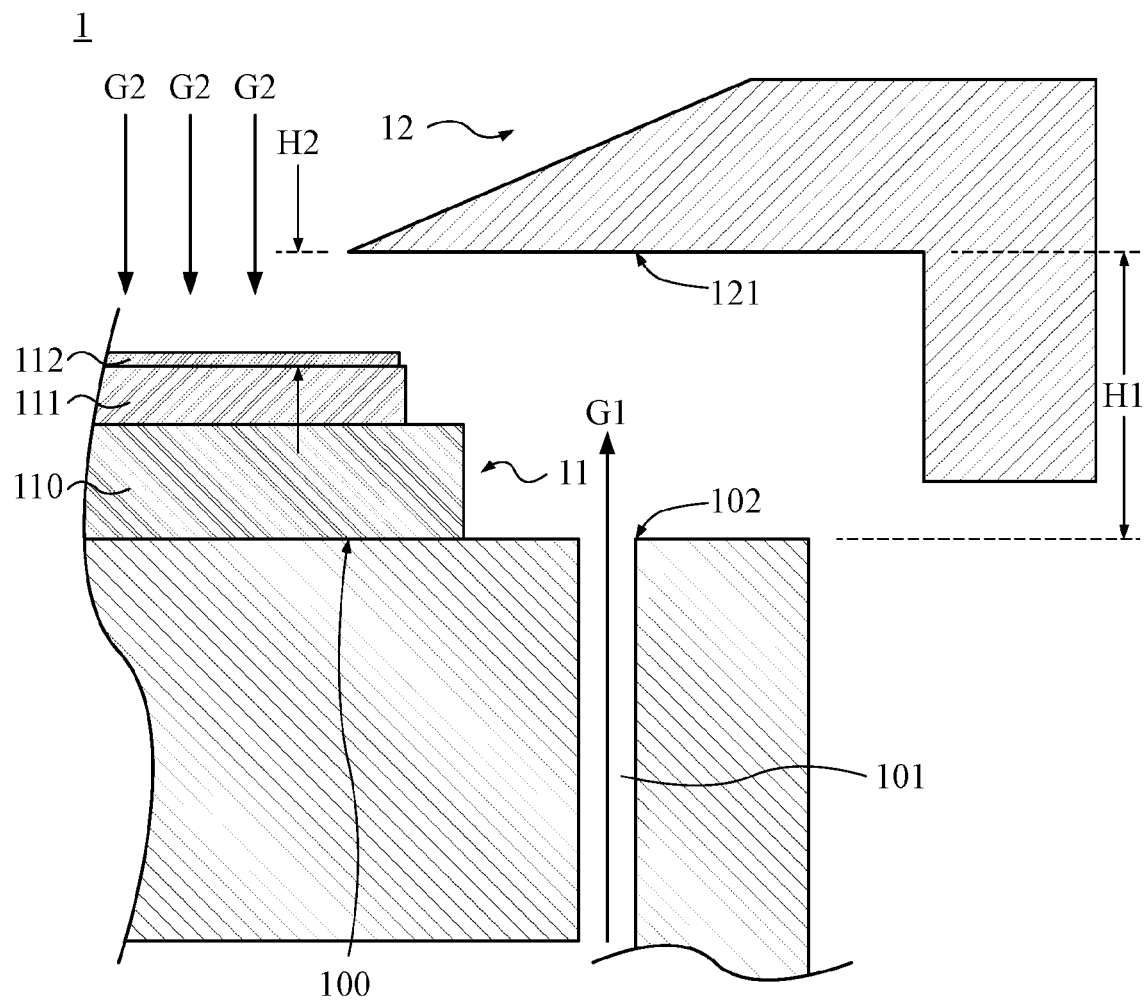
Figure 8:
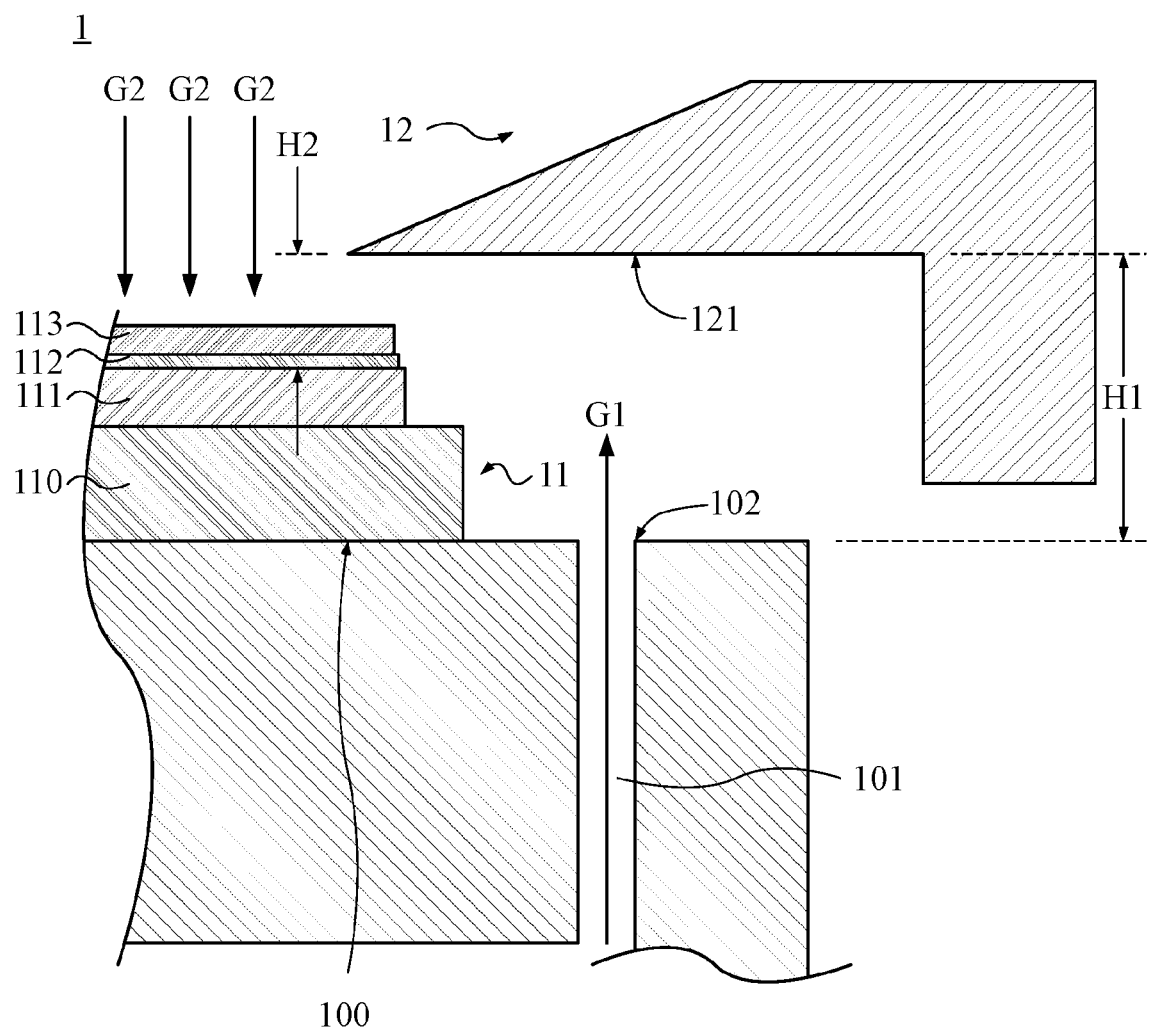
Figure 8:
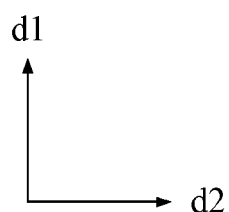

FIGS. 6 to 8 are side sectional views of the nitride-based wafer CVD device according to steps of the depositing method of some embodiments of the present disclosure. Referring to FIGS. 6 to 8, after the nitride-based wafer 11 is disposed, the deposition method comprises: depositing conductive materials on the nitride-based wafer 11. Since the distance H1 is 1.15 mm, the gap between the oxide layer 111 and the polished surface 121 is sufficient, and the conductive materials can be deposited without peeling. In some embodiment, the distance H1 is in a range from 1.1 mm to 1.2 mm.

To be specific, referring to FIG. 6, in the deposition method of this embodiment, the step of depositing the conductive materials on the nitride-based wafer 11 comprises: providing hydrogen G1 through the gas tunnel 101 of the heat carrier 10. The hydrogen G1 is provided by the gas source 14 connected to the gas tunnel 101. Since the heat carrier 10 remain a proper distance H1 from the clamping ring 12, the hydrogen G1 from the opening 102 can reach the nitride-based wafer 11 easily, and conductive materials can be deposited properly.

In one aspect, the gas provider 13 of the nitride-based wafer CVD device 1 is disposed above the carrier surface 100, and the step of depositing conductive materials on the nitride-based wafer 11 comprises: providing tungsten hexafluoride, hydrogen, nitrogen and silane through the gas provider 13. Also, in some circumstances, the step of depositing conductive materials on the nitride-based wafer 11 may comprises: providing tungsten hexafluoride and silane through the gas provider 13.

Referring to FIG. 7, the step of disposing conductive materials on the nitride-based wafer includes: depositing a conductive layer 112 on the nitride-based wafer 11. During the deposition, the hydrogen G1 is provided through the opening 102 of the gas tunnel 101, and the gas G2 is provided by the gas provider 13 as shown in FIG. 6. The gas G2 includes tungsten hexafluoride, hydrogen, nitrogen and silane. Since the distance H1 between the carrier surface 100 and the polished surface 121 is sufficient, the conductive layer 112 can be deposited without peeling, and the conductive layer 112 includes titanium nitride.

Referring to FIG. 8, the step of disposing conductive materials on the nitride-based wafer includes: depositing a conductive layer 113 on the conductive layer 112. During the deposition, the hydrogen G1 is provided through the opening 102 of the gas tunnel 101, and the gas G2 is provided by the gas provider 13 as shown in FIG. 6. The gas G2 includes tungsten hexafluoride and silane. Since the distance H1 between the carrier surface 100 and the polished surface 121 is sufficient, the conductive layer 113 can be deposited without peeling, and the conductive layer 113 includes tungsten.

Figure 9:
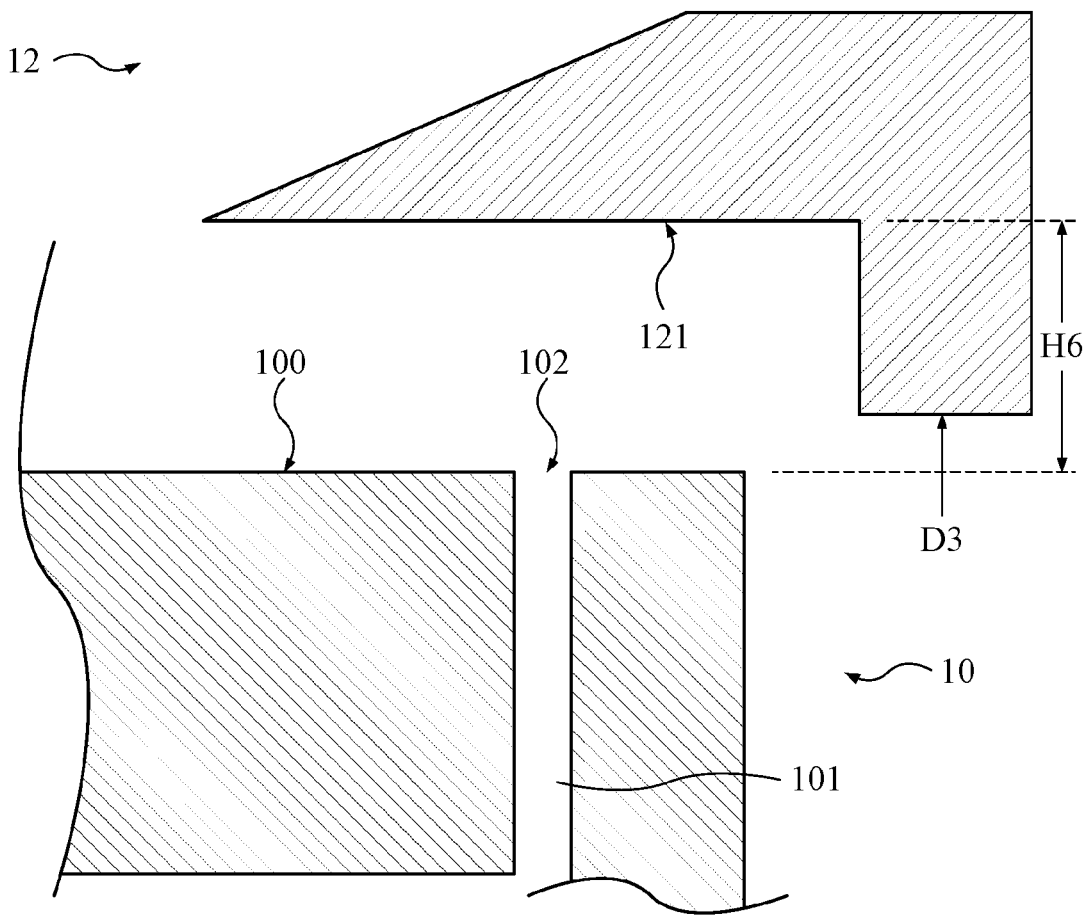
FIGS. 9 and 10 are side sectional views of a nitride-based wafer CVD device according to steps of a deposition method of some embodiments of the present disclosure.
Figure 10:
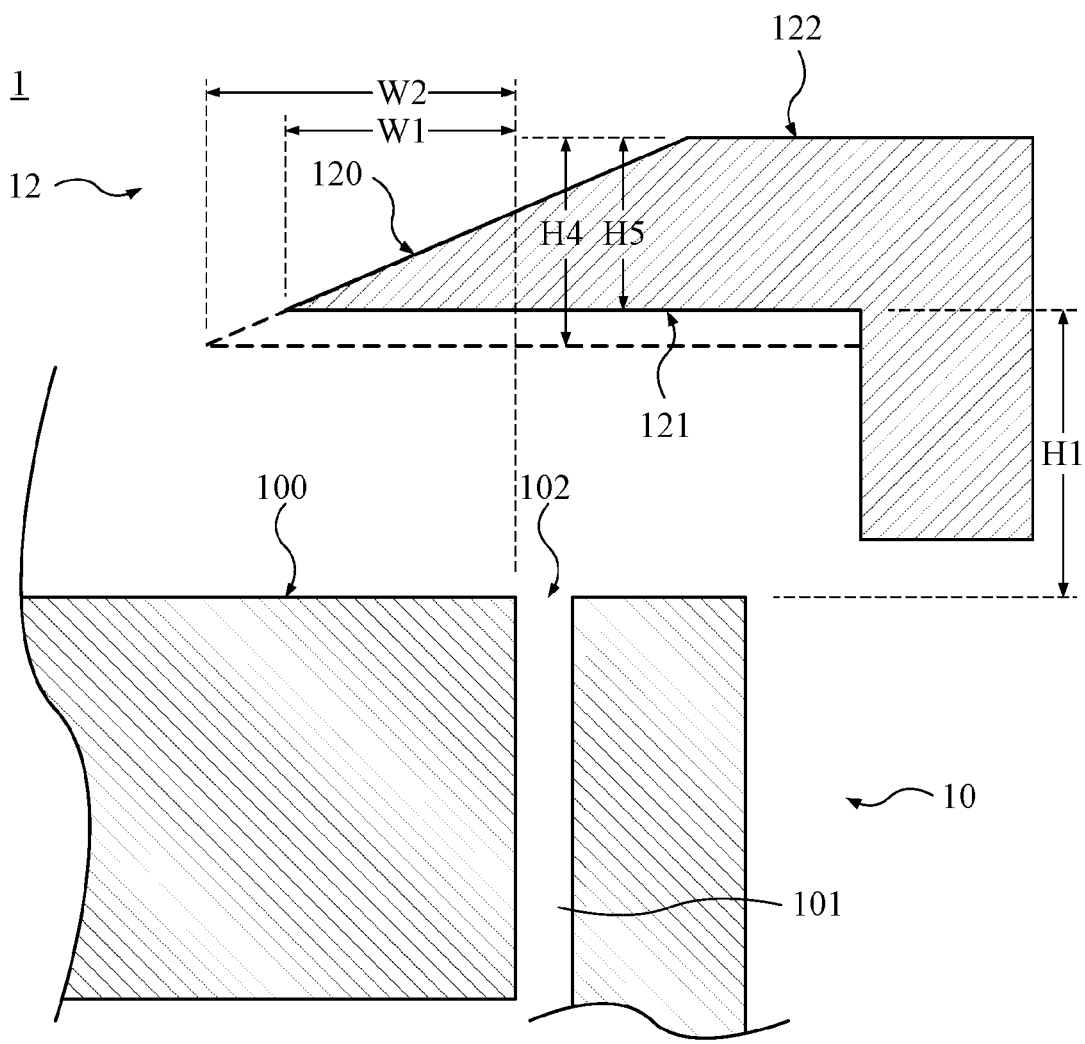

FIGS. 9 and 10 are side sectional views of the nitride-based wafer CVD 1 according to steps of another deposition method of some embodiments of the present disclosure. The deposition method of the nitride-based wafer CVD 1 of this embodiment comprises: moving a clamping ring 12 upward, wherein a polished surface 121 of the clamping ring 12 is moved away from a carrier surface 100 of a heat carrier 10. Referring to FIG. 9, in this embodiment, the clamping ring 12 moves up a distance D3 upward, and a distance H6 between the carrier surface 100 and the polished surface 121 is increased. For example, the distance H6 is 1.1 mm. Therefore, the space between the carrier surface 100 and the polished surface 121 is increased, and the space between the opening 102 of the gas tunnel 101 and the polished surface is increased as well.

Referring to FIG. 10, the deposition method further comprises: grinding the clamping ring 12 so as to reduce a thickness of the clamping ring 12. To be specific, the clamping ring 12 has the tilted surface 120, the polished surface 121, and the top surface 122, and the thickness between the top surface 122 and the polished surface 121 is reduced. For example, the thickness is reduced from thickness H4 to thickness H5. For example, along the direction d1, the thickness H4 is 1.34 mm, and the thickness H5 is 1.2 mm. The distance H1 between the polished surface 121 and the carrier surface 100 is increased. The space between the clamping ring 12 and the heat carrier 10 is further increase, and a gap between the polished surface 121 of the clamping ring 12 and the carrier surface 100 of the heat carrier 10 is increased, and a gap between the polished surface 121 of the clamping ring 12 and the opening 102 of the gas tunnel 101 is increased. Therefore, a gas flow from the opening 102 can easily transfer to a substance on the carrier surface 100. For example, the distance H1 is 1.15 mm.

In some embodiment, the deposition method may proceed with the following steps without grinding the clamping ring 12.

Figure 11:
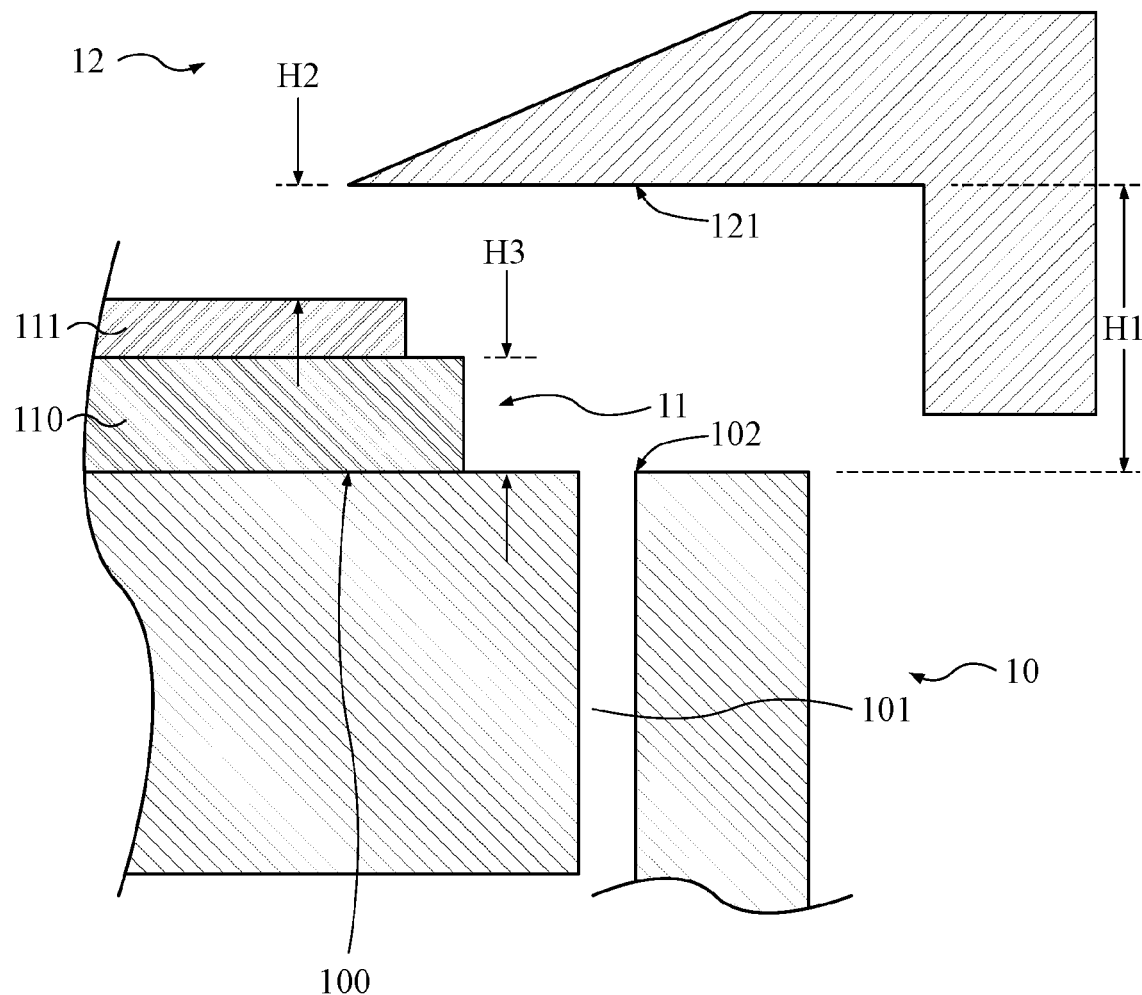
FIG. 11 is a side sectional view of a nitride-based wafer CVD device according to a step of a deposition method of some embodiments of the present disclosure.
Figure 11:
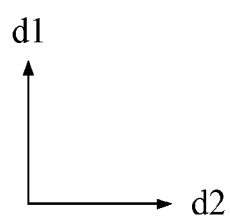

FIG. 11 is a side sectional view of the nitride-based wafer CVD 1 according to a step of the deposition method of some embodiments of the present disclosure. After the clamping ring 12 is moved, the deposition method comprises: disposing a nitride-based wafer 11 on the carrier surface 100 of the heat carrier 10, wherein the nitride-based wafer 11 has a plurality of HEMT devices.

In this embodiment, the nitride-based wafer 11 comprises an oxide layer 111 covering the HEMT devices. The nitride-based wafer 11 has a substrate 110, and the HEMT devices are disposed on the substrate 110. Also, the thickness H3 of the substrate 110 is 1150 µm, and the substrate 110 may have nitride layer that include GaN or AlGaN.

In one aspect, A distance H2 between the polished surface 121 and the oxide layer 111 in the direction d1 is 0.05 mm. Therefore, oxide layer 111 keep a gap with the clamping ring 12, and a sufficient gas is provided through the gap, and a conductive layer can be disposed properly on the oxide layer 111.

Figure 12:
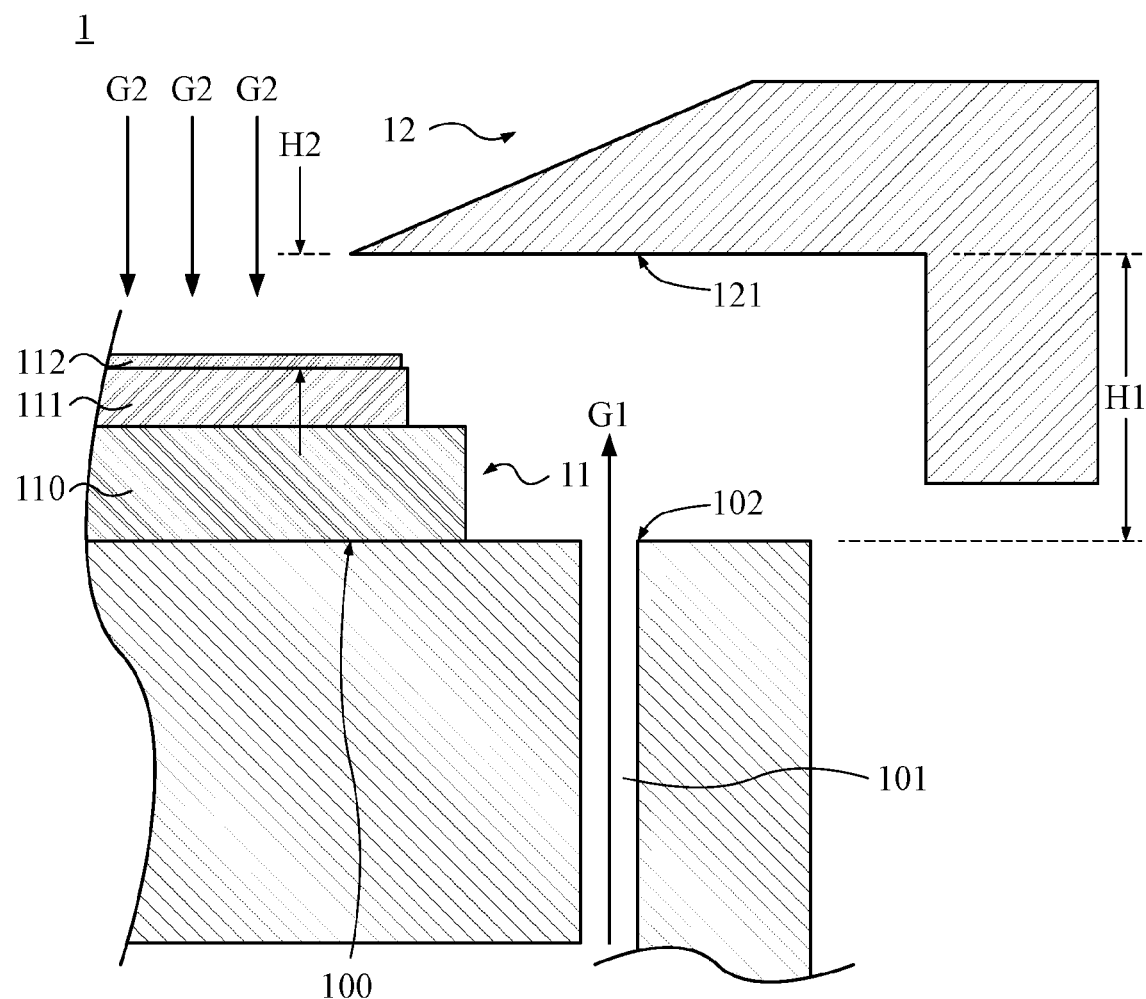
FIG. 12 is a side sectional view of a nitride-based wafer CVD device according to a step of a deposition method of some embodiments of the present disclosure.
Figure 12:
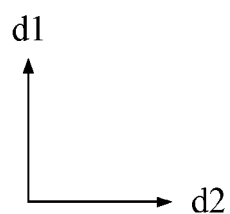

FIG. 12 is a side sectional view of the nitride-based wafer CVD device 1 according to a step of the deposition method of some embodiments of the present disclosure. After the nitride-based wafer 11 is disposed, the deposition method of this embodiment comprises: depositing a conductive layer 112 on the HEMT devices. The conductive layer 112 may include titanium nitride or titanium.

Since the nitride-based wafer 11 has the oxide layer 111, the oxide layer 111 covered by the conductive layer 112 such that the gas flow goes through a gap between the oxide layer 111 and the clamping ring 12. Therefore, the conductive layer 112 can be deposited without peeling.

Figure 13:
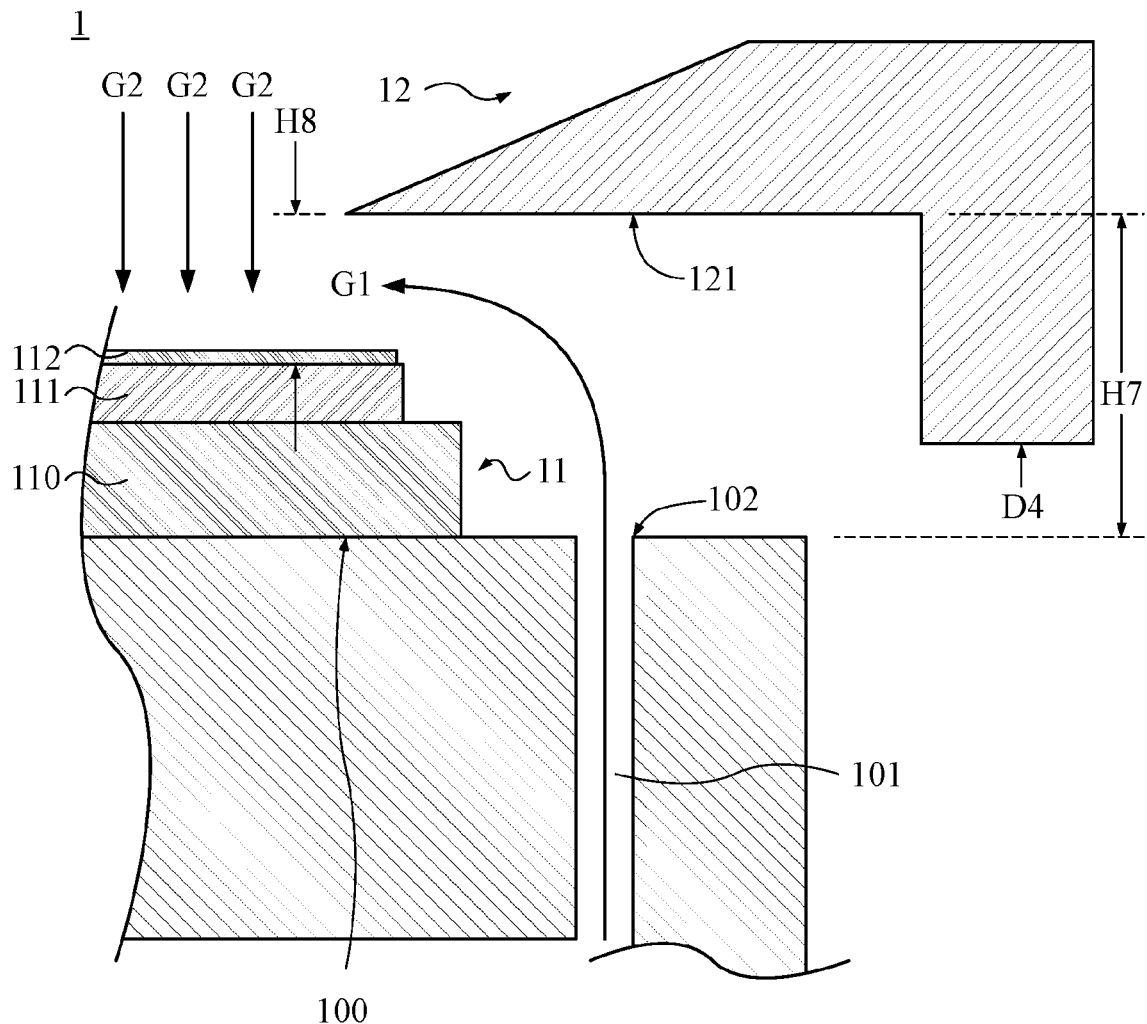
FIGS. 13 and 14 are side sectional views of a nitride-based wafer CVD according to steps of a deposition method of some embodiments of the present disclosure.
Figure 13:
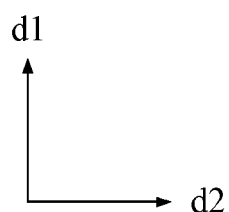
Figure 14:
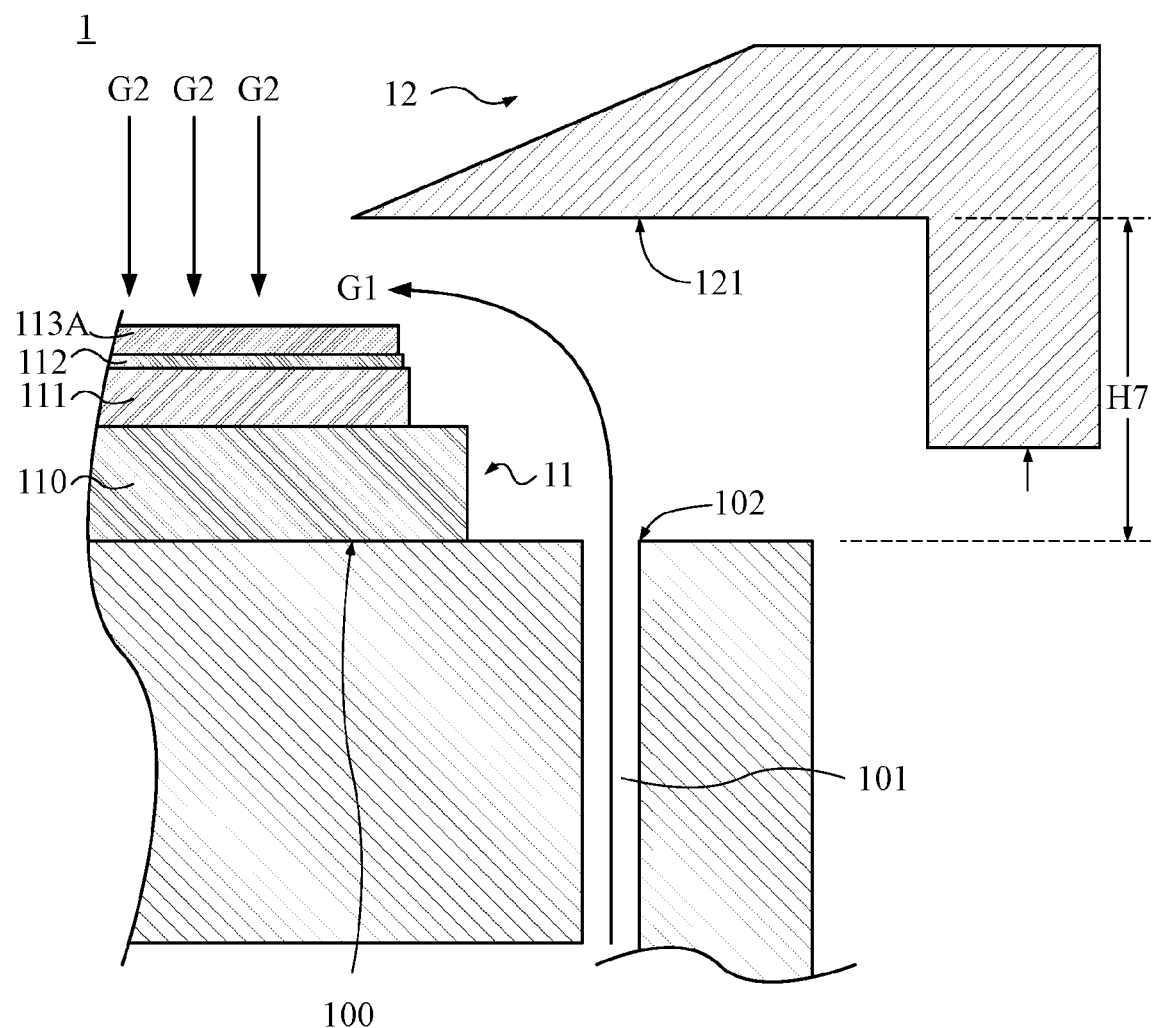
Figure 14:
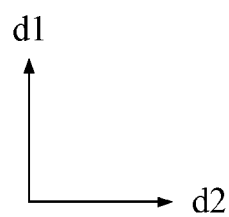

FIGS. 13 and 14 are side sectional views of the nitride-based wafer CVD 1 according to steps of the deposition method of some embodiments of the present disclosure. After the conductive layer 112 is deposited, the deposition method of this embodiment comprises: depositing a tungsten layer 113A covering the conductive layer; and introducing a gas flow upward from a gap between the nitride-based wafer 11 and the clamping ring 12 into a gap between the conductive layer 112 and the clamping ring 12 at a condition of a distance H7 between the carrier surface 100 and the clamping ring 12 increased to 1.2 mm. Since the distance H7 is increased to 1.2 mm, and the gas flow (hydrogen G1) is introduced, the tungsten layer 113A can be properly deposited without peeling.

Referring to FIG. 13, the deposition method of this embodiment further comprises: readjusting a distance D4 between the oxide layer 111 and the clamping ring 12 prior to depositing the tungsten layer 113A as shown in FIG. 14. The gap between the oxide layer 111 and the clamping ring 12 is further increased, and the tungsten layer 113A can be properly deposited without peeling.

In one aspect, in the deposition method of this embodiment, the clamping ring 12 moves vertically after depositing the conductive layer 112 on the HEMT device and prior to depositing the tungsten layer 113A. The clamping ring 12 moves along direction d1, which is vertical direction, and distance H7 is increased to 1.2 mm, and the distance between the polished surface 121 and the carrier surface 100 is further increased. The gas flow (hydrogen G1) can be sufficient provide during the deposition of the tungsten layer 113A, and the gas G2 is sufficiently provided during the deposition as well, and the tungsten layer 113A can be deposited without peeling.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about"

are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based wafer chemical vapor deposition (CVD) device comprising:
    a heat carrier comprising a carrier surface;
    a nitride-based wafer disposed on the carrier surface; and
    a clamping ring disposed above the carrier surface and the nitride-based wafer;
    wherein the clamping ring comprises:
        a tilted surface; and
        a polished surface being opposite to the tilted surface,
    wherein the nitride-based wafer has a plurality of high electron mobility transistor (HEMT) devices;
    wherein the polished surface and the carrier surface are parallel;
    wherein a distance between the polished surface and the carrier surface in a first direction is in a range from 1.1 mm to 1.2 mm, and the first direction is parallel to a normal of the carrier surface.

2. The nitride-based wafer CVD device of claim 1, wherein the clamping ring covers a ring-shaped area on the carrier surface, and a width of the clamping ring covering the carrier surface is in a range from 19.94 mm to 20.06 mm.

3. The nitride-based wafer CVD device of claim 1, wherein the nitride-based wafer has an oxide layer, and the oxide layer covers the HEMT devices, and the distance between the polished surface and the oxide layer in the first direction is in a range from 0.03 to 0.07 mm.

4. The nitride-based wafer CVD device of claim 1, wherein the nitride-based wafer comprises a substrate, and the HEMT devices are disposed on the substrate, and the thickness of the substrate is in a range from 1100 µm to 1200 µm.

5. The nitride-based wafer CVD device of claim 1, wherein the heat carrier has a gas tunnel, and the gas tunnel forms an opening surrounding the carrier surface.

6. The nitride-based wafer CVD device of claim 5, wherein the gas tunnel is configured to provide hydrogen.

7. The nitride-based wafer CVD device of claim 5, wherein the gas tunnel is connected to a space between the clamping ring and the heat carrier.

8. The nitride-based wafer CVD device of claim 1, further comprising a gas provider disposed above the carrier surface, wherein the gas provider is configured to provide tungsten hexafluoride and silane.

9. The nitride-based wafer CVD device of claim 1, wherein the clamping ring is ground and the thickness of the clamping ring is reduced, and the distance between the carrier surface and the polished surface is increased.

10. The nitride-based wafer CVD device of claim 1, wherein the nitride-based wafer comprises:
    a substrate;
    an oxide layer disposed on the substrate;
    a first conductive layer disposed on the oxide layer; and
    a second conductive layer disposed on the first conductive layer,
    wherein a horizontal width between an edge of the first conductive layer and an edge of the second conductive layer is less than 200 µm.

11. The nitride-based wafer CVD device of claim 10, wherein the first conductive layer includes titanium nitride, and the second conductive layer includes tungsten.

12. A deposition method of a nitride-based wafer chemical vapor deposition (CVD) device comprising:
    grinding a clamping ring and reducing a thickness of the clamping ring, wherein a polished surface is formed on the clamping ring;
    disposing a nitride-based wafer on a carrier surface of a heat carrier; and
    depositing conductive materials on the nitride-based wafer,
    wherein the nitride-based wafer CVD device comprises the heat carrier, the nitride-based wafer, and the clamping ring, and the heat carrier comprises the carrier surface, and the clamping ring is disposed above the carrier surface and the nitride-based wafer, and the clamping ring comprises a tilted surface, and the polished surface being opposite to the tilted surface,
    wherein the nitride-based wafer has a plurality of high electron mobility transistor (HEMT) devices, wherein the polished surface and the carrier surface are parallel, wherein the distance between the polished surface and the carrier surface in a first direction is in a range from 1.1 mm to 1.2 mm, and the first direction is parallel to a normal of the carrier surface.

13. The deposition method of claim 12, wherein the step of grinding the clamping ring and reducing the thickness of the clamping ring comprises:

grinding the thickness of the clamping ring from 1.35 mm to 1.20 mm.

14. The deposition method of claim 12, the step of grinding the clamping ring and reducing the thickness of the clamping ring comprising:

grinding a ring-shaped area of the clamping ring that covers the heat carrier, wherein the width of the clamping ring covering the heat carrier is reduced from 20.3 mm to 20 mm.

15. The deposition method of claim 12, the step of grinding the clamping ring and reducing the thickness of the clamping ring comprising:

grinding the clamping ring and increasing the distance between the polished surface and the carrier surface in the first direction.

16. The deposition method of claim 12, wherein the nitride-based wafer has an oxide layer, and the oxide layer covers the HEMT devices, and the distance between the polish surface and the oxide layer in the first direction is in a range from 0.03 mm to 0.07 mm.

17. The deposition method of claim 12, wherein the nitride-based wafer comprises a substrate, and the HEMT devices are disposed on the substrate, and the thickness of the substrate is in a range from 1100 μm to 1200 μm.

18. The deposition method of claim 12, wherein the heat carrier has a gas tunnel, and the step of depositing the conductive materials on the nitride-based wafer comprises:

providing hydrogen through the gas tunnel;

wherein the gas tunnel forms an opening surrounding the carrier surface.

19. The deposition method of any one of claim 12, wherein the nitride-based wafer CVD device comprises a gas provider, and the gas provider is disposed above the carrier surface, wherein the step of depositing conductive materials on the nitride-based wafer comprises:

providing tungsten hexafluoride and silane through the gas provider.

20. The deposition method of claim 12, the step of disposing conductive materials on the nitride-based wafer including:

deposing a first conductive layer on the nitride-based wafer; and deposing a second conductive layer on the first conductive layer, wherein the first conductive layer includes titanium nitride, and the second conductive layer includes tungsten.

* * * * *